United States Patent [19]

Suzuki et al.

[11] Patent Number: 4,599,155

[45] Date of Patent: Jul. 8, 1986

[54] RESIN COMPOSITION

[75] Inventors: Shuichi Suzuki, Yokohama; Moriyasu Wada, Ninomiya; Shuzi Hayase, Kawasaki, all of Japan

[73] Assignee: Kabushiki Kaisha Toshiba, Kawasaki, Japan

[21] Appl. No.: 653,089

[22] Filed: Sep. 21, 1984

[30] Foreign Application Priority Data

Sep. 22, 1983 [JP] Japan ................................. 58-174162

[51] Int. Cl.[4] .............................................. C08F 2/46
[52] U.S. Cl. ........................................ 522/8; 522/99;
528/25; 522/40; 522/43; 528/26; 522/44;
522/46; 528/27; 522/33; 522/47; 528/16;
522/53; 522/54; 525/450; 522/57; 525/533;
522/12; 522/14; 522/16; 522/17; 522/18;
522/20; 522/21; 522/23; 522/26; 522/27;
522/28; 522/30
[58] Field of Search .............. 528/27, 25, 26, 16;
525/450, 533; 204/159.13

[56] References Cited

U.S. PATENT DOCUMENTS

| | | | |
|---|---|---|---|
| 4,119,579 | 10/1978 | Capozza | 528/403 |
| 4,335,367 | 6/1982 | Mitsui et al. | 528/27 |
| 4,434,103 | 2/1984 | Interrante | 528/27 |

FOREIGN PATENT DOCUMENTS 56-47433  4/1981  Japan .
56-72007  6/1981  Japan .

OTHER PUBLICATIONS

Bailey, William J. Synthesis of Monomers that Expand on Polymerization (J. Elastoplastics.) vol. 5 (Jul. 1973), pp. 142–152.

*Primary Examiner*—Melvyn I. Marquis
*Attorney, Agent, or Firm*—Schwartz, Jeffery, Schwaab, Mack, Blumenthal & Evans

[57] ABSTRACT

There is disclosed a resin composition comprising
(A) a spiro ortho ester compound and/or a spiro ortho carbonate compound;
(B) an aluminum compound; and
(C) a silanol compound or a silicon compound which is capable of generating a silanol group;

the amounts of components (B) and (C) being within the range of 0.001 to 10% by weight and 0.1 to 20% by weiht, based on the amount of component (A), respectively.

The resin composition of this invention is excellent in volumetric shrinkage performance at curing operation and is good in storability. Therefore, the cured product can be used for a wide variety of industrially valuable applications, such as an ink, a coating, an adhesive, a surface coating, an encapsulation and an electrical insulating material.

22 Claims, No Drawings

RESIN COMPOSITION

BACKGROUND OF THE INVENTION

This invention relates to a resin composition, more particularly to a resin composition having a low volumetric shrinkage percentage at curing.

Generally, reins such as an unsaturated polyester resin, an acrylic resin, a phenol resin, an epoxy resin and the like undergo volumetric shrinkage at curing. This shrinkage causes defects of the appearance of the obtained material, and generates internal stress that causes cracks and other characteristic changes in (and even the destruction of) material sealed in the resin. Even in an epoxy resin which undergoes the least shrinkage among them, 3 to 5% of the volumetric shrinkage occurs and, by the shrinkage at curing, various kinds of problems have been caused.

Heretofore, in order to overcome these problems, for example, a method has been employed in which an inorganic filler such as silica, calcium carbonate or alumina has been added to the resin composition, thereby lessening the volumetric shrinkage of the resin. However, in this method, the viscosity of resin composition is remarkably increased by the addition of the filler so that it has the inconvenience that an injection operation and other manipulations at a low temperature become difficult. That the method can not be used to obtain moldings having good transparency also presents a problem.

Further, a method has been disclosed in which shrinkage stress at curing has been lessened by optimizing the conditions of the curing process, in that strain on the moldings is decreased lessen by gradually raising the curing temperature or the moldings are annealed over a long period of time after curing and then the curings are taken out. In this case, however, there is also the defect that more complicated process has been required. Accordingly, conventional methods present no fundamental solution, and it is impossible to remove or remarkably reduce the shrinkage at curing of the aforesaid resins.

On the other hand, as the other method as mentioned above, investigations were made to lower the shrinkage by a resin alone. For example, Kobunshi, 27, p. 108, (1978) discloses an 1,4,6-trioxaspiro[4,4]nonane. When this compound is made to be bifunctional, it can be used as a thermosetting resin, as mentioned in J. Macromol. Sci. Chem. A9, p. 849 (1975) and J. Polym. Sci. Polym. Symp, 56, p. 117 (1976).

According to these journal articles, to a bisspiroester compound, having a skeltal structure which comprises hydroquinone or bisphenol A, trifluoroborate-diethyl ether complex was added as a catalyst, and there were carried out a ring-opening curing reaction at room temperature for 24 hours. According to this method, by using a strong catalyst such as trifluoroborate-diethyl ether complex, the life of the resin composition is short and handling thereof is difficult, and corrosiveness to a metal is remarkable, but it is possible to make shrinkage of the resin zero at curing.

SUMMARY OF THE INVENTION

It is an object of this invention to overcome the problems mentioned above and to provide a resin composition having excellent shrinkage characteristics at a curing operation and good storability, and thus can be used for wide variety of applications such as an ink, a coating, an adhesive, a surface coating, an encapsulation, and an electrical insulating material.

A resin composition of this invention comprises
(A) a spiro ortho ester compound and/or a spiro ortho carbonate compound;
(B) an aluminum compound; and
(C) a silanol compound or a silicon compound which is capable of generating a silanol group;
the amounts of components (B) and (C) being within the range of 0.001 to 10% by weight and 0.1 to 20% by weight, based on the amount of component (A), respectively.

DESCRIPTION OF THE PREFERRED EMBODIMENTS

In the component (A) to be used in this invention, the spiro ortho ester compound is the compound which can be obtained by reacting an epoxy compound and a lactone by the usual method. Examples of the method include a method in which the starting materials are subjected to addition reaction in the presence of a catalyst such as trifluoroborate or trifluoroborate-diethyl ether complex.

The epoxy compound to be used in this invention includes monofunctional epoxy compounds and polyfunctional epoxy compounds. Examples of the monofunctional epoxy compounds include ethylene oxide, propylene oxide, butylene oxide, styrene oxide, phenyl glycidyl ether, butyl glycidyl ether, etc. Examples of the polyfunctional epoxy compounds are not limited particularly, but they may include a bisphenol A type epoxy resin; a bisphenol F type epoxy resin; a phenol-novolac type epoxy resin; an alicyclic epoxy resin; a heterocyclic ring-containing epoxy resin such as triglycidyl isocyanurate, hydantoin epoxy, or the like; a hydrogenated bisphenol A type epoxy resin; an aliphatic epoxy resin such as propylene glycol-diglycidyl ether, pentaerythritol-polyglycidyl ether or the like; a glycidyl ester type epoxy resin obtained by the reaction of an aromatic, aliphatic or alicyclic carboxylic acid with epichlorohydrin; a spiro ring-containing epoxy resin; a glycidyl ether type epoxy resin which is a reaction product of an o-allyl-phenol-novolac compound and epichlorohydrin; a glycidyl ether type epoxy resin which is a reaction product of a diallyl bisphenol compound, having an allyl group at the o-position of each of the hydroxyl groups in bisphenol A, and epichlorohydrin; etc.

Suitable lactones include β-propiolactone, γ-butyrolactone, α-chlorobutyrolactone, β-methylbutyrolactone, γ,γ-dimethylbutyrolactone, γ-valerolactone, δ-valerolactone, ε-caprolactone, phthalide, etc.

The spiro ortho ester compound to be used in this invention include the following compounds:

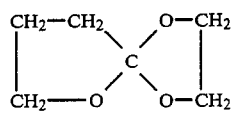

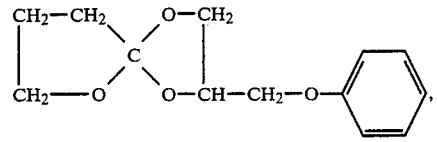

-continued

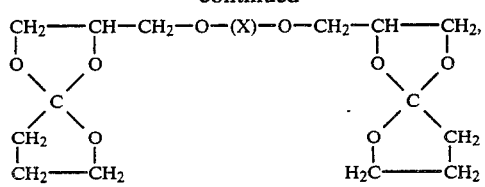

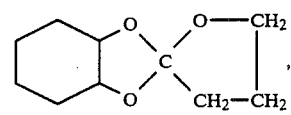

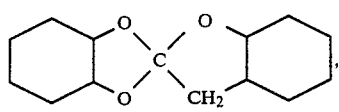

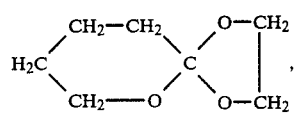

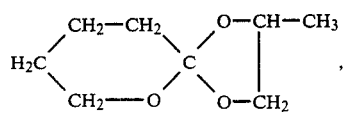

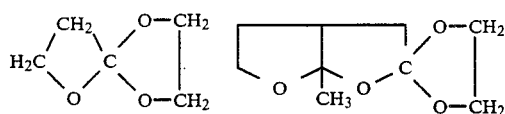

wherein X represents a group of

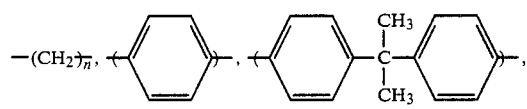

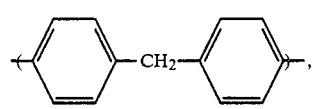

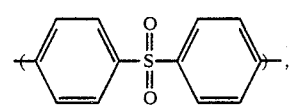

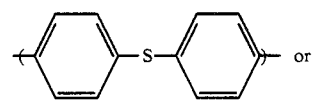

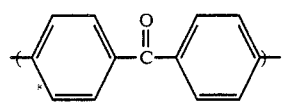

where n is an integer of 2 to 12.

On the other hand, the spiro ortho carbonate compound is a compound having the following formula:

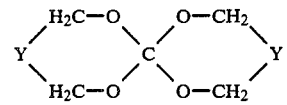

wherein Y represents a divalent hydrocarbon group such as

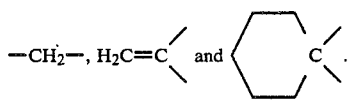

The aforesaid spiro ortho carbonate compound may be produced by, for example, reacting $Bu_2Sn=O$ with a polyalcohol and then reacting $CS_2$ thereto.

Examples of the polyalcohols include pentaerythrytol, propylene glycol, etc.

Examples of the spiro carbonate compound include the following compounds:

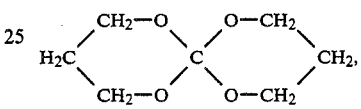

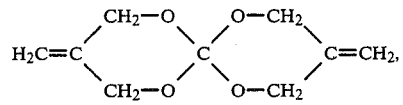

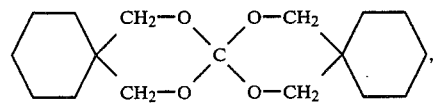

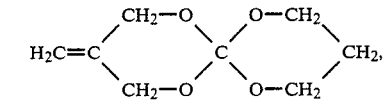

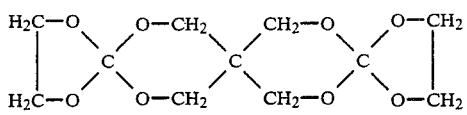

and the like.

The component (B) to be used in this invention is preferably a complex compound of an organic aluminum which is bonded one or more ligands, to the aluminum atom, such as an alkoxy group, a phenoxy group, an acyloxy group, a β-diketonato group, an o-carbonylphenolato group, etc.

Of the above organic groups, examples of the alkoxy group include a methoxy group, an ethoxy group, an isopropoxy group, a butoxy group, a pentoxy group, etc;, examples of the phenoxy group may include a phenoxy group, an o-methylphenoxy group, an o-methoxyphenoxy group, a p-nitrophenoxy group, a 2,6-dimethylphenoxy group, etc; examples of the acyloxy group may include an acetato group, a propionato group, an isopropionato group, a butylato group, a stearato group, an ethylacetoacetato group, a propylacetoacetato group, an isopropylacetoacetato group, a butylacetoacetato group, a diethylmalonato group, a dipivaloylmethanato group, etc.; examples of the β-diketonato group may include an acetylacetonato group, a trifluoroacetylacetonato group, a hexafluoroacetylacetonato group,

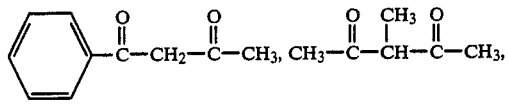

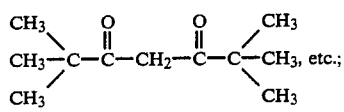

and examples of the o-carbonylphenolato group may include a salicylaldehydato group, etc.

More specifically, examples of the aluminum compounds mentioned above include trismethoxyaluminum, trisethoxyaluminum, trisisopropoxyaluminum, trisphenoxyaluminum, tris(p-methylphenoxy)aluminum, isopropoxydiethoxyaluminum, trisbutoxyaluminum, trisacetoxyaluminum, trisstearatoaluminum, trisbutylatoaluminum, trispropionatoaluminum, trisisopropionatoaluminum, trisacetylacetoanatoluminum, trisfluoroacetylacetonatoaluminum, trishexafluoroacetylacetonatoaluminum, trisethylacetoacetatoaluminum, tris(n-propylacetoacetato)aluminum, tris(isopropylacetoacetato)aluminum, tris(n-butylacetoacetato)aluminum, trissalicylaldehydatoaluminum, trisdiethylmalonatoaluminum, trispropylacetoacetatoaluminum, trisbutylacetoacetatoaluminum, trisdipivaloylmethanatoaluminum, diacetylacetonatodipivaloylmethanatoaluminum,

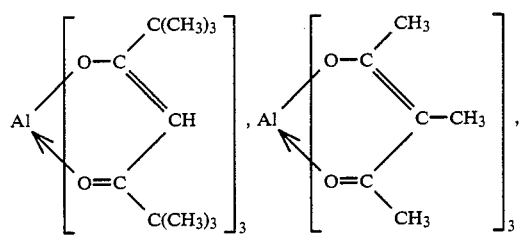

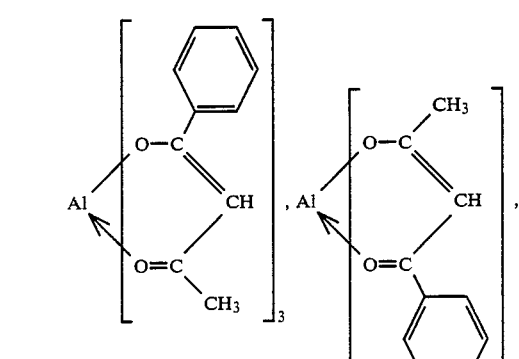

-continued

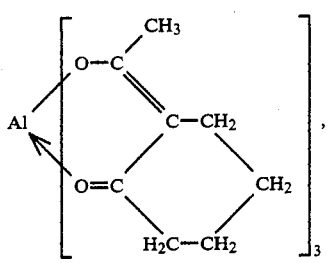

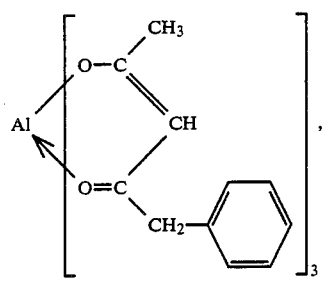

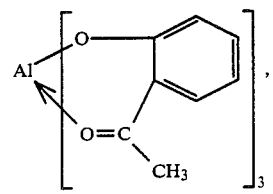

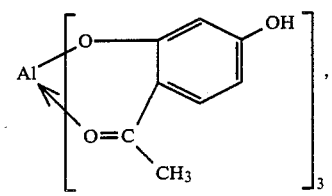

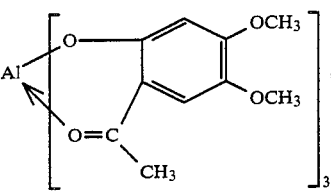

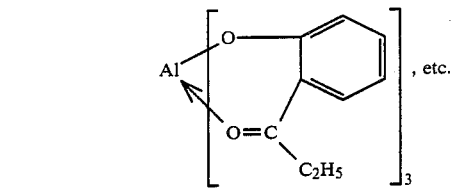

These components (B) may be used alone or in combination. The compound(s) should be mixed preferably in an amount of 0.001 to 10% by weight, more preferably in an amount ranging from 0.1 to 5% by weight, based on the epoxy resin. If the amount is less than 0.001% by weight, sufficient curability of the product will not be obtained, if it exceeds 10% by weight on the other hand, a high cost of production and a poor electrical property of the product will be caused thereby.

The silanol compound of component (C) to be used in this invention is the compound represented by one of the following formula (I) or (II):

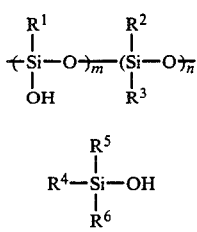

wherein $R^1$, $R^2$ and $R^3$ each represent a hydrogen atom, an alkyl group, a phenyl group or an unsaturated group which may be substituted with an alkoxy group or may have a side chain of silicon group; m is any number of 1 or more; n is 0 or any number of 1 or more; and $R^4$, $R^5$ and $R^6$ each represent an alkyl group, a phenyl group, an alkoxy group or a hydroxy group;

and the compound may not be always the same type of compound or may be a mixture of compounds each having different molecular weights. Examples of these compounds include triphenylsilanol, diphenylsilanediol, diphenylmethylsilanol, trischlorophenylsilanol, trisfluoromethylphenylsilanol, phenyldimethylsilanol, phenylmethylsilanediol, diphenylethylsilanol, diphenylpropylsilanol, phenylpropylsilanediol, diphenylbutylsilanol, phenylbutylsilanediol and the like.

As the silicon compound which is capable of generating a silanol group of component (C) to be used in this invention, any of the precursors which is capable of generating a silanol by the conventional method may be employed to this invention. Preferably, a compound which generates a silanol group by hydrolysis or irradiation of light is used.

Examples of the silicon compound which generates a silanol by hydrolysis include the organosilanes and organopolysiloxanes.

The organosilane are represented by the following formula (III):

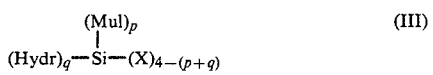

wherein Mul represents a phenyl group, a vinyl group, a 2-butenyl group or a 2-pentenyl group; Hydr represents a hydrolyzable group; X represents a substituted or unsubstituted alkyl group having 1 to 5 carbon atoms (provided that the substituent is an inactive group which does not participate in the polymerization reaction) or an aralkyl group which may have a substituent inactive in the polymerization reaction; and p represents an integer of 1 to 3, q represents an integer from 1 to 4, and p+q are 4 or less.

Among the suitable organosilane as mentioned above, preferable examples are triphenylmethoxysilane, diphenylvinylmethoxysilane, triphenylethoxysilane, phenyldivinylmethoxysilane, diphenyldiethoxysilane, tri(p-nitrophenyl)methoxysilane, triacetylmethoxysilane, 2-butenyldiphenylmethoxysilane, di(2-pentenyl)phenylethoxysilane, trifluoroacetylphenyldiethoxysilane, diphenylbenzoylmethoxysilane, tri(p-ethylphenyl)propoxysilane, diphenyldiacetoxysilane, diphenyldipropionyloxysilane, diphenylbis(triphenylacetoxy)silane,

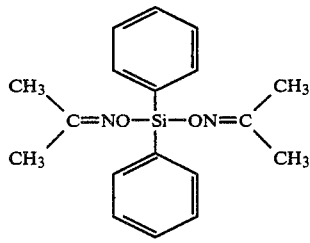

and the like.

The organosiloxane comprises the bifunctional unit represented by the following formula (IV) and/or the trifunctional unit represented by the following formula (V), and the terminal end of the organosiloxane chain has been stopped with the monofunctional unit represented by the following formula (VI):

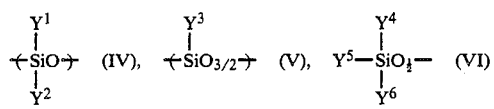

wherein $Y^1$, $Y^2$, $Y^3$, $Y^4$, $Y^5$ and $Y^6$ may be the same or different and each represent a hydrolyzable group; a multiple bonding group; or a substituted or unsubstituted alkyl group having 1 to 5 carbon atoms provided that the each substituent is an inactive group which does not participate to the polymerization reaction.

Particularly preferable are the compounds containing at least one of the bifunctional unit represented by the following formula (VII) and the monofunctional unit represented by the following formula (VIII):

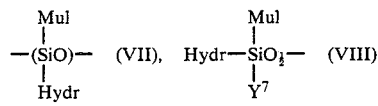

wherein Mul and Hydr have the same meanings as defined above; and $Y^7$ has the same meaning as $Y^1$ to $Y^6$ as defined above.

Among the above organosiloxanes, particularly preferable to this invention is the one which has a polymerization degree of 50 or less and has a siloxane unit equivalent (which was calculated by dividing an average molecular weight by an average number of siloxane units of the formulas (VII) and (VIII) containing in one molecule) represented by the formulas (VII) and (VIII) being 700 or less.

As the organosiloxanes mentioned above, more preferable examples to this invention include 1,3-dimethoxy-1,3-dimethyl-1,3-diphenyldisiloxane, 1,5-diethoxy-1,3,5-trimethyl-1,3,5-triphenyltrisiloxane, 1,7-dimethoxy-1,3,5,7-tetramethyl-1,3,5,7-tetraphenyltetrasiloxane, 1,3-dimethoxytetraphenyldisiloxane, 1,5-dimethoxy-3,3-dimethyl-1,1,5,5-tetraphenyltrisiloxane, 1,3,5-trimethoxypentaphenyltrisiloxane, 1,5-dimethoxyhexa(p-tolyl)trisiloxane,

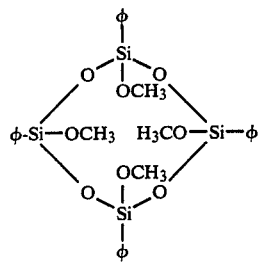

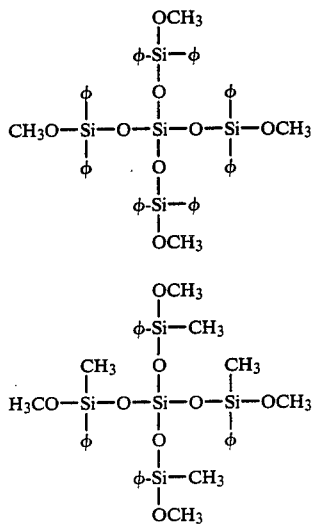

(φ: phenyl group)

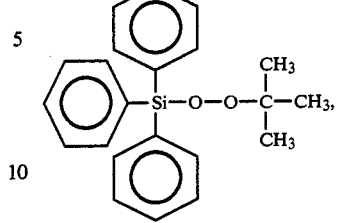

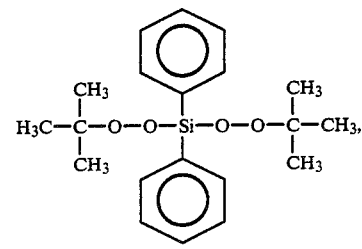

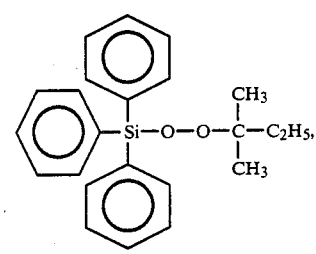

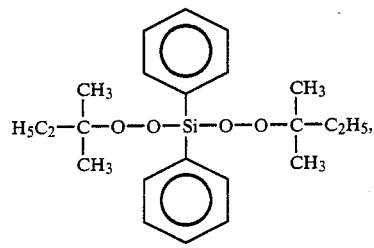

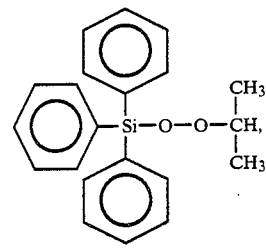

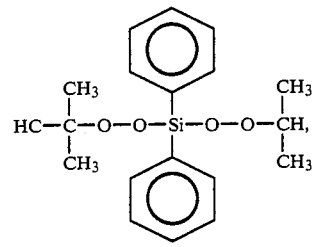

As the organic silicon compound which generates a silanol group by irradiation of light, they preferably include a silicon compound which has at least one of a peroxysilyl group, an o-nitrobenzyloxy group or an α-ketosilyl group.

Among these silicon compounds, the silicon compound having a peroxysilyl group is a compound represented by the following formula (IX):

$$(R^7)_r Si-O-O-R^8)_{4-r} \qquad (IX)$$

$R^7$ represents a hydrogen atom, a halogen atom, an alkyl group having 1 to 5 carbon atoms, an alkoxy group having 1 to 5 carbon atoms or an aryl group; $R^8$ represents an alkyl group having 1 to 5 carbon atoms or an aryl group; and r is an integer of 0 to 3.

In the above formula, examples of the alkyl group having 1 to 5 carbon atoms include a methyl group, an ethyl group, an n-propyl group, an isopropyl group, an n-butyl group, a t-butyl group, a sec-butyl group, an n-pentyl group, etc.; examples of the alkoxy group having 1 to 5 carbon atoms include a methoxy group, an ethoxy group, an n-propoxy group, an isopropoxy group, an n-butoxy group, a t-butoxy group, a sec-butoxy group, an n-pentoxy group, etc.; examples of the aryl group include a phenyl group, a naphthyl group, an anthranyl group, a benzyl group, etc. The alkyl group having 1 to 5 carbon atoms and the aryl group may have a substituent or substituents such as a halogen atom, a nitro group, a cyano group or a methoxy group.

More specifically, examples of the silicon compound having the peroxysilyl group are compounds of the following formulas:

-continued

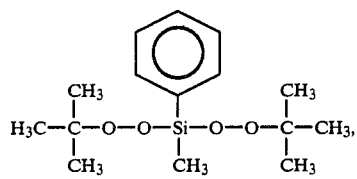

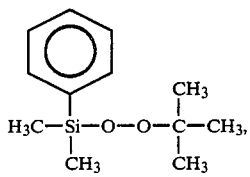

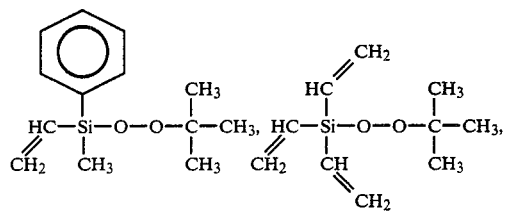

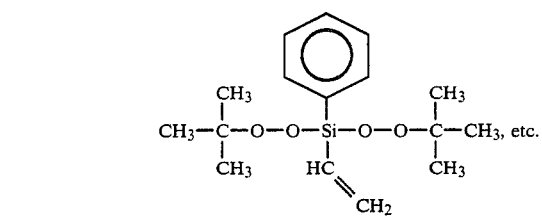

The silicon compound having an o-nitrobenzyloxy group is a compound represented by the following formula (X):

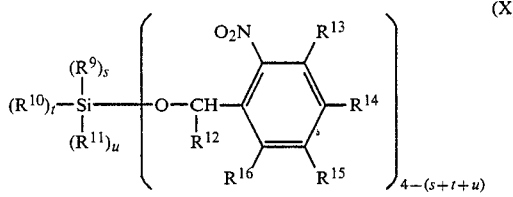

wherein $R^9$, $R^{10}$ and $R^{11}$ may be the same or different and each represent a hydrogen atom, a halogen atom, a vinyl group, an allyl group, a substituted or unsubstituted alkyl group having 1 to 10 carbon atoms, an alkoxy group having 1 to 10 carbon atoms, a substituted or unsubstituted aryl group, an aryloxy group or a siloxy group; $R^{12}$ represents a hydrogen atom, a substituted or unsubstituted alkyl group having 1 to 10 carbon atoms or a substituted or unsubstituted phenyl group; $R^{13}$, $R^{14}$, $R^{15}$ and $R^{16}$ may be the same or different and represent a hydrogen atom, a nitro group, a cyano group, a hydroxy group, a mercapto group, a halogen atom, an acetyl group, an allyl group, an alkyl group having 1 to 5 carbon atoms, an alkoxy group having 1 to 5 carbon atoms, a substituted or unsubstituted aryl group or aryloxy group; and s, t and u are integers satisfying the conditions of $0 \leq s$, t, $u \leq 3$ and $1 \leq s+t+u \leq 3$.

Examples of the substituted or unsubstituted alkyl group having 1 to 10 carbon atoms are a methyl group, an ethyl group, a propyl group, a butyl group, a t-butyl group, a pentyl group, a chloromethyl group, a chloroethyl group, a fluoromethyl group and a cyanomethyl group; examples of an alkoxy group having 1 to 10 carbon atoms are a methoxy group, an ethoxy group, an n-propoxy group and an n-butoxy group; examples of a substituted or unsubstituted aryl group are a phenyl group; a p-methoxy phenyl group, a p-chlorophenyl group and a p-trifluoromethylphenyl group; and examples of an aryloxy group are a phenoxy group.

Alternatively, the organic silicon compound may be a compound having as a terminal group an o-nitrobenzyloxysilyl group and as a principle chain a group represented by the formula (XI):

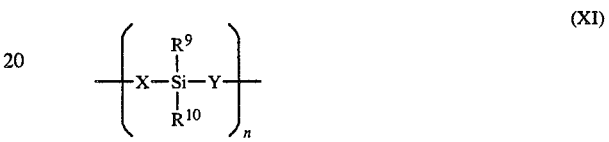

wherein n is an integer of 1 or more; $R^9$ and $R^{10}$ have the same meanings as defined above; and X and Y may be the same or different and each represent an oxygen atom, an alkylene group; an aryl group, or the like.

Examples of the organic silicon compound having the substituted or unsubstituted o-nitrobenzyloxy group bonded directly to a silicon atom include the following compounds:

(1) trimethyl(o-nitrobenzyloxy)silane,
(2) dimethylphenyl(o-nitrobenzyloxy)silane,
(3) diphenylmethyl(o-nitrobenzyloxy)silane,
(4) triphenyl(o-nitrobenzyloxy)silane,
(5) vinylmethylphenyl(o-nitrobenzyloxy)silane,
(6) t-butylmethylphenyl(o-nitrobenzyloxy)silane,
(7) triethyl(o-nitrobenzyloxy)silane,
(8) tri(2-chloroethyl)-o-nitrobenzyloxysilane,
(9) tri(p-trifluoromethylphenyl)-o-nitrobenzyloxysilane,
(10) trimethyl[α-(o-nitrophenyl)-o-nitrobenzyloxy]silane,
(11) dimethylphenyl[α-(o-nitrophenyl)-o-nitrobenzyloxy]silane,
(12) methylphenyldi[α-o-nitrophenyl)-o-nitrobenzyloxy]silane,
(13) triphenyl(α-ethyl-o-nitrobenzyloxy)silane,
(14) trimethyl(3-methyl-2-nitrobenzyloxy)silane,
(15) dimethylphenyl(3,4,5-trimethoxy-2-nitrobenzyloxy)silane,
(16) triphenyl(4,5,6-trimethoxy-2-nitrobenzyloxy)silane,
(17) diphenylmethyl(5-methyl-4-methoxy-2-nitrobenzyloxy)silane,
(18) triphenyl(4,5-dimethyl-2-nitrobenzyloxy)silane,
(19) vinylmethylphenyl(4,5-dichloro-2-nitrobenzyloxy)silane,
(20) triphenyl(2,6-dinitrobenzyloxy)silane,
(21) diphenylmethyl(2,4-dinitobenzyloxy)silane,
(22) triphenyl(3-methoxy-2-nitrobenzyloxy)silane,
(23) vinylmethylphenyl(3,4-dimethoxy-2-nitrobenzyloxy)silane,
(24) dimethyldi(o-nitrobenzyloxy)silane,
(25) methylphenyldi(o-nitrobenzyloxy)silane,
(26) vinylphenyldi(o-nitrobenzyloxy)silane,

(27) t-butyldi(o-nitrobenzyloxy)silane,
(28) diethyldi(o-nitrobenzyloxy)silane,
(29) 2-chloroethylphenyldi(o-nitrobenzyloxy)silane,
(30) diphenyldi(o-nitrobenzyloxy)silane,
(31) diphenyldi(3-methoxy-2-nitrobenzyloxy)silane,
(32) diphenyldi(3,4-dimethoxy-2-nitrobenzyloxy)silane,
(33) diphenyldi(2,6-dinitrobenzyloxy)silane,
(34) diphenyldi(2,4-dinitrobenzyloxy)silane,
(35) methyltri(o-nitrobenzyloxy)silane,
(36) phenyltri(o-nitrobenzyloxy)silane,
(37) p-bis(o-nitrobenzyloxydimethylsilyl)benzene,
(38) 1,1,3,3-tetraphenyl-1,3-di(o-nitrobenzyloxy)siloxane,
(39) 1,1,3,5,5-hexaphenyl-1,5-di(o-nitrobenzyloxy)siloxane, and
(40) a silicon compound formed by reaction of SiCl-containing silicone resin and o-nitrobenzyl alcohol.

Next, the silicon compound having an α-ketosilyl group is a compound represented by the following formula (XII):

$$(R^{17})_v\text{-Si}(-\overset{O}{\overset{\|}{C}}-R^{17})_{4-v} \quad (XII)$$

wherein $R^{17}$ each represents a hydrocarbon group such as an alkyl group having 1 to 10 carbon atoms, a vinyl group, an allyl group and an aryl group, and an aryloxy group and an alkoxy group having 1 to 10 carbon atoms, which groups, however, may have a substituent or substituents such as a halogen atom, —NO₂, —CN or —OCH₃; and v represents an integer of 0, 1, 2 or 3.

Examples of this commpound may include the following compounds:

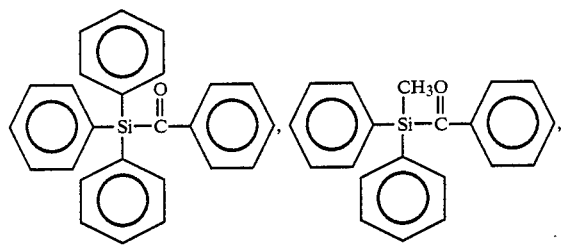

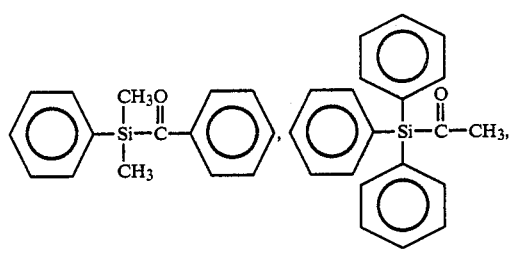

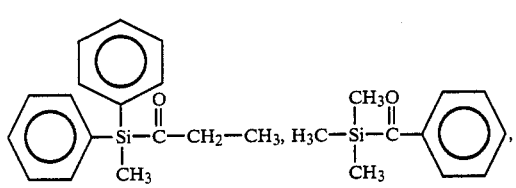

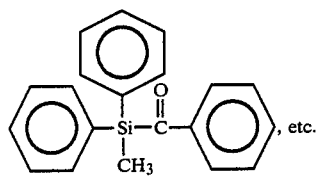, etc.

The organic silicon compounds as exemplified above may be used alone or in combination of two or more kinds.

The silicon compound of the above component (C) should be mixed preferably in an amount ranging from 0.1 to 20% by weight, more preferably in an amount of 1 to 15% by weight based on the component (A). If the amount is less than 0.1% by weight, sufficient curability will not be obtained. On the other hand, an amount in excess of 20% by weight could be possible, but the cost of production becomes high and a product formed by decomposition of the catalyst components may cause some problems whereby it is not preferable.

The resin composition of this invention may contain a photosensitizer, if desired.

As the photosensitizer which may optionally be used in this invention, there may be employed any of those which are capable of photosensitizing the foregoing compounds, and which are selected depending on the kinds of the component (A), light source, etc.

Examples of the above photosensitizers may include aromatic hydrocarbons, benzophenone and derivatives thereof, esters of o-benzoylbenzoic acids, acetophenone and derivatives thereof, benzoin and benzoin ethers and derivatives thereof, xanthone and derivatives thereof, thioxanthone and derivatives thereof, disulfide compounds, quinone compounds, halogenated hydrocarbons, amines, etc.

Examples of the aromatic hydrocarbon may include benzene, benzene-d₆, toluene, p-xylene, fluorobenzene, chlorobenzene, bromobenzene, iodobenzene, naphthalene, 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodonaphthalene, 2-iodonaphthalene, 1-naphthol, 2-naphthol, biphenyl, fluorene, p-terphenyl, acenaphthene, p-quaterphenyl, triphenylene, phenanthrene, azulene, fluoroanthene, chrycene, pyrene, 1,2-benzpyrene, anthracene, 1,2-benzanthracene, 9,10-dichloroanthracene, 9,10-dibromoanthracene, 9,10-diphenylanthracene, perylene, tetracene, pentacene, benzyl, etc.

Examples of the benzophenone and the derivatives thereof may include benzophenone, 2,4-dimethylbenzophenone, 2,4-dichlorobenzophenone, 4,4'-bis(dimethylamino)benzophenone, etc.

Examples of the esters of o-benzoylbenzoic acids include methyl o-benzoylbenzoate, ethyl o-benzoylbenzoate, phenyl o-benzoylbenzoate,

-continued

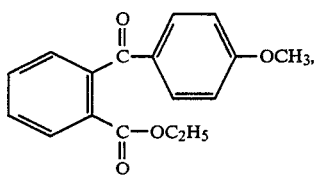

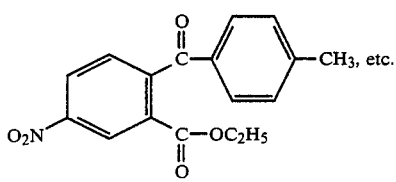

Examples of the acetophenone and the derivatives thereof include acetophenone, 4-methylacetophenone, 3-methylacetophenone, 3-methoxyacetophenone, etc.

Examples of the benzoin, the benzoin ethers and the derivatives of these include benzoin, benzoin methyl ether, benzoin ethyl ether, benzoin isopropyl ether, benzoin n-butyl ether, benzoin triphenylsilyl ether,

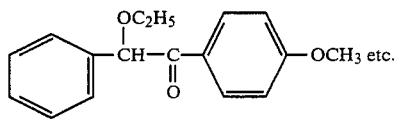

Examples of the xanthone and the derivatives thereof include xanthone, 2,4-dimethylxanthone, 2,4-dichloroxanthone, etc.

Examples of the thioxanthone and the derivatives thereof include thioxanthone, 2,4-dimethylthioxanthone, 2,4-dichlorothioxane, etc.

Examples of the disulfide compounds include;

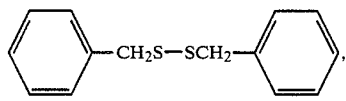

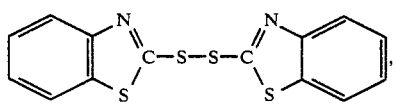

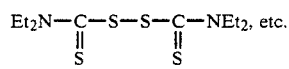

Examples of the quinone seriese compounds include benzoquinone, naphthoquinone, anthraquinone, 5,12-naphthacene dione, 2,7-pyrene dione, etc.

Examples of the halogenated hydrocarbons include carbon tetrachloride, hexachloroethane, carbon tetrabromide,

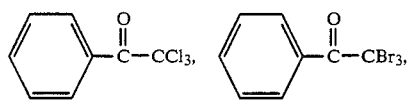

-continued

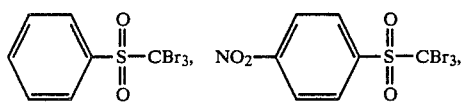

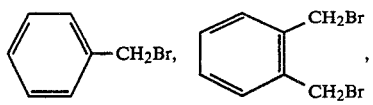

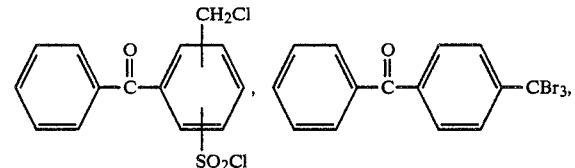

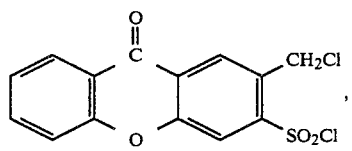

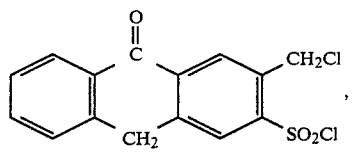

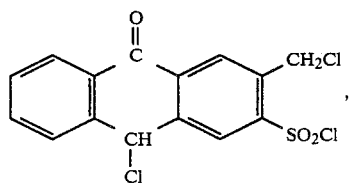

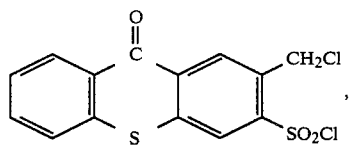

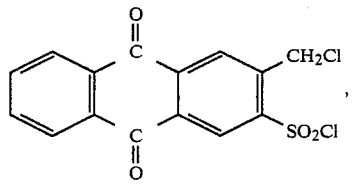

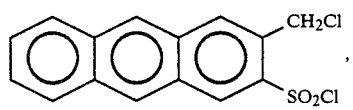

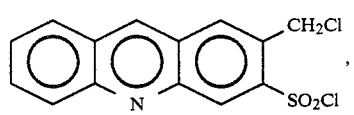

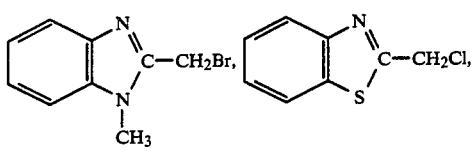

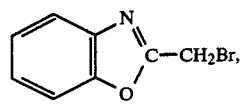

Examples of the amines include diphenylamine, carbazole, triphenylamine,

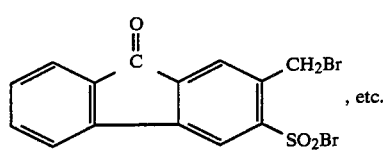

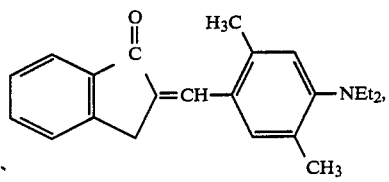

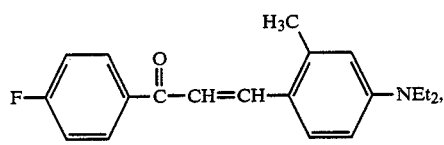

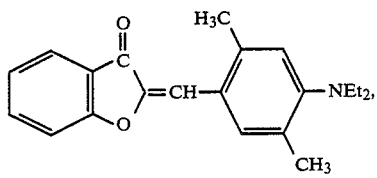

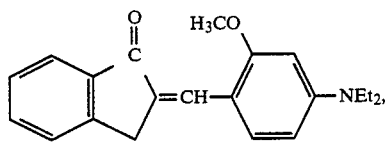

Examples of the other photosensitizers include propiophenone, anthrone, benzaldehyde, butylophenone, 2-naphthylphenylketone, 2-naphthaldehyde, 2-acetonaphthone, 1-naphtylphenylketone, 1-acetonaphthone, 1-naphthoaldehyde, fluorenone, 1-phenyl-1,2-propane dione, benzoethrile, acetone, biacetyl, acridine orange, acridine, Rhodamine-B, eosine, fluorescein,

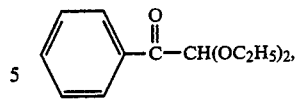

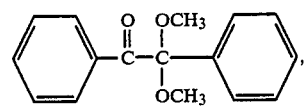

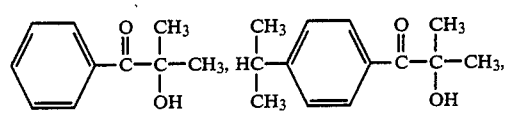

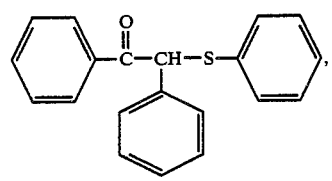

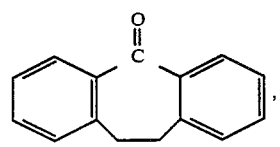

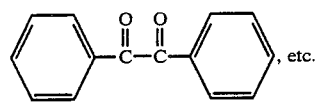

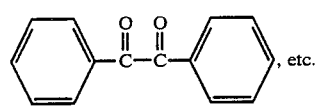

The photosensitizers as exemplified above may be used alone or in combination of two or more kinds, and should be mixed preferably in an amount of from 0.001 to 15% by weight, more preferably 0.01 to 8% by weight, based on the component (A).

The resin composition of this invention may further contain a carboxylic acid and its anhydride as a hardner. As the carboxylic acid and its anhydride, there may be mentioned, for example, various kinds of polycarboxylic acid compounds such as adipic acid; and phthalic acid, hexahydrophthalic acid, tetrahydrophthalic acid, methyltetrahydrophthalic acid, methylhexahydrophthalic acid, nadic acid, methylnadic acid, chlorendic acid, dodecylnyl succinic acid, methylsuccinic acid, benzophenone tetracarboxylic acid, pyromellitic acid and maleic acid, and anhydrides of the above-mentioned acids.

The resin composition of this invention may optionally contain a phenol derivative and the like as a hardner. Such a phenol derivative may include bisphenol A type, bisphenol F type, bisphenol K type, thiobisphenol, phenol novolac, cresol novolac and the like.

The resin composition of this invention may optionally contain an epoxy compound as a copolymerizable compound. Such an expoy compound may include the epoxy compound which is employed for synthesizing the component (A) to be used in this invention.

This invention will be described in more detail by the following Examples:

PREPARATION OF THE ORTHO SPIRO ESTER COMPOUND (a) A carbon tetrachloride solution containing 95 g of an epoxy resin (Epikote 828; trade name, available from Shell Kagaku K. K., Japan; epoxy equivalent: 190) was added dropwise to a carbon tetrachloride solution of 86 g of γ-butyrolactone and 2 ml of trifluoroborate-diethyl ether complex over about 1 hour. The reaction was carried out at 5° to 10° C. After completion of the reaction, stirring was continued while maintaining the temperature constantly for 30 minutes, and then 1.8 g of triethyl amine (the reaction stopper) was added thereto.

After partially gelled products were separated by filtration, the filtrate was added dropwise into excess amount of ethanol. Precipitates were collected by filtration and washed with ethanol to obtain the reaction product (A) (a spiro ortho ester compound). An absorption derived from an epoxy group (913 cm$^{-1}$) cannot be admitted from the infrared spectrum data thereof.

(b) The same procedures were carried out as in aforesaid (a) except that 67 g of the epoxy resin (Celoxide 4221; trade name, available from Daisel K. K., epoxy equivalent: 134) was employed as the epoxy resin to obtain the reaction product (B) (a spiro ortho ester compound).

EXAMPLES 1 TO 5

By using, as the spiro ortho ester compounds, the reaction products (A) and (B); as the aluminum compounds, tris(acetylcetonato)aluminum (TAANA), tris(ethylacetoacetato)aluminum (TEAACA) and tris(-salicylaldehydato)aluminum (TSAA); as the silanol compounds or silicon compounds capable of generating a silanol group, triphenylsilanol (TPSH) and triphenylmethoxy silane (TPMS); further as the epoxy compounds, Celoxide 2021 (trade name, available from Daisel K. K., alicyclic, epoxy equivalent: 145) and Epikote 828 (trade name, Available from Shell Kagaku K. K., Japan, bisphenol A type, epoxy equivalent: 190 to 210); and as the carboxylic acid commpound, adipic acid and maleic acid; in amounts (shown parts by weight) as shown in the following Table 1, 5 kinds of the resin compositions of this invention were obtained.

COMPARATIVE EXAMPLES 1 TO 3

Three kinds of compositions were obtained as comparative examples by formulating (parts by weight) the reaction product (A); tris(ethylacetoacetato)aluminum (TEAACA) and trifluoroborate-diethyl ether complex-added TEAACA (0.5 PMR); and triphenylsilanol (TPSH) as shown in Table 1.

The evaluation test of the volumetric shrinkage percentage and the crack index in Examples 1 to 5 and Comparative examples 1 to 3 were carried out as follows:

Volumetric shrinkage percentage: Each compositions was heated and cured at 120° C. for 2 hours and then at 160° C. for 10 hours. Each of the thus cured products was measured a specific gravity at 25° C. and the volumetric shrinkage percentage was calculated from the variance of the specific gravities of before and after curing.

Crack index: Measurements of the crack resistance was carried out by using the oliphant-wascher method, each of five test pieces were allowed to stand in an oven for 30 minutes as a high temperature side and in dry ice-alcohol for 10 minutes as a low temperature side and these operations were repeated. And this cold-and-hot cycle was applied so as to increase the temperature differences between the high temperature side and the low temperature side along with the increment of the repeated cycle times. Then, the cycle number when cracks were arised was averaged arithmetically to obtain the value as the crack index. The resuts were shown in Table 1.

TABLE 1

|  |  | Example |  |  |  |  | Comparative example |  |  |
|---|---|---|---|---|---|---|---|---|---|
|  |  | 1 | 2 | 3 | 4 | 5 | 1 | 2 | 3 |
| Spiro ortho ester | (A) | 100 | — | 80 | 100 | 100 | 100 | 100 | 100 |
|  | (B) | — | 100 | 20 | — | — | — | — | — |
| Aluminum compound | TAANA | — | — | 1 | 2 | — | — | — | — |
|  | TEAACA | 2 | 1 | 1 | — | 2 | 2 | — | — |
|  | TSAA | — | 1 | — | — | — | — | — | — |
| Silicon compound | TPSH | 3 | — | 1 | — | 3 | — | 3 | — |
|  | TPMS | — | 3 | 2 | 2 | — | — | — | — |
| Epoxy compound | Celoxide 2021 | — | — | — | 20 | — | — | — | — |
|  | Epikote 828 | — | — | — | — | 20 | — | — | — |
| Carboxylic acid | Adipic acid | — | — | — | — | 5 | — | — | — |
|  | Maleic acid | — | — | — | 5 | — | — | — | — |
| Volumetiric percentage | shrinkage (%) | −1.41 (expantion) | −1.34 (expantion) | −1.37 (expantion) | 0.35 | 0.25 | *1 | *1 | *2 |
| Crack index |  | 13.6 | 11.4 | 12.6 | 7.8 | 9.5 |  |  |  |

*1 Sample was not cured.
*2 Sample was immediately gelated after addition of the catalyst, so cured product has not been obtained.

EXAMPLES 6 TO 11

By using, as the spiro ortho ester compounds, the reaction products (A) and (B); as the aluminum compounds, tris(ethylacetoacetato)aluminum (TEAACA), tris(propylacetoacetato)aluminum (TPAAA), tris(acetylacetonato)aluminum (TAANA) and tris(-salicylaldehydato)aluminum (TSAA); as the silanols or silicon compounds capable of generating a silanol group,

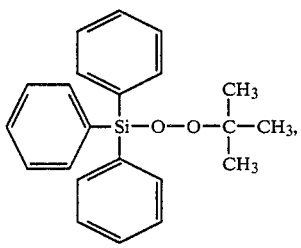

(a)

-continued (b)

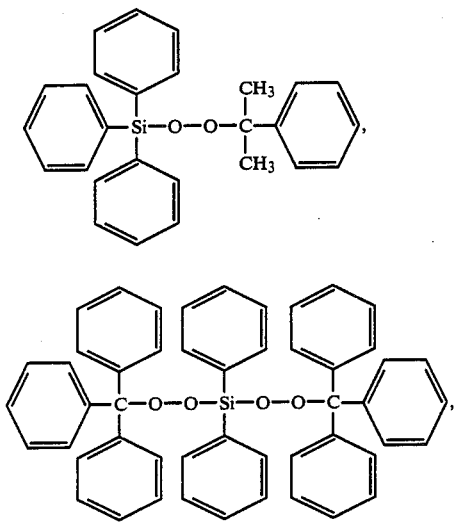

(c)

as the photosensitizers, benzophenon and thioxanthone; and as the epoxy compounds, Celoxide 2021 (trade name, available from Daisel K. K., alicyclic, epoxy equivalent: 145) and Epikote 828 (trade name, Available from Shell Kagaku K. K., Japan, bisphenol A type, epoxy equivalent: 190 to 210); in amounts (shown parts by weight) as shown in the following Table 2, 6 kinds of the resin compositions of this invention were prepared.

Measurement results and evaluation tests of the days to gelatinization; thickness of the film; pencil hardness; and adherence concerning the samples in Examples 6 to 11 and Comparative example 4 were carried out as follows:

Namely, these compositions were coated by a conventional manner onto a tin plate which had been polished with No. 400 abrasive paper. Then, these plates were introduced in the photocuring box in which 80 W/cm of three stes of air-cooling mercury lamps had beed positioned at a height of 6.5 cm from a conveyer face, and 3 minutes irradiation was conducted. By finger-checking, a composition which was not cured was repeatedly irradiated with light in the box until the curing has been completed, and then post-curing was carried out for each of the cured product at 150° C. for 3 hours.

After completion of the curing, the pencil hardness test of the film and the cross-cut adhesion test, which was conducted by cross-cutting the film and taking off an adhered tape from the film, were carried out to examine the hardness of the film and the adhesion to the tin plate, respectively. Further, prior to photocuring, each of the photocurable composition was allowed to stand at 25° C. in dark place and measured the number of days until the composition cures.

COMPARATIVE EXAMPLE 4

An ultra-violet ray curable resin was synthesized by reacting 280 g of epoxy resin (Epikote 828; trade name, Shell Kagaku K. K., Japan, epoxy equivalent: 190) and 114 g of acrylic acid in the presence of each 0.5 g of hydroquinone and triethylene diamine at 120° to 125° C. The obtained resin was confirmed that no presence of an epoxy group and an acrylic group was bonded to all of them from the measurement results of the epoxy equivalent and IR spectrum. With the thus obtained resin (200 g) were mixed 10 g of benzophenon and 15 g of pentaerythrytol acrylate to prepare a photocurable resin.

The results of Examples 6 to 11 and Comparative example 4 are shown in Table 2 all together.

TABLE 2

|  |  | Example |  |  |  |  |  | Comparative example 4 |
|---|---|---|---|---|---|---|---|---|
|  |  | 6 | 7 | 8 | 9 | 10 | 11 |  |
| Spiro ortho ester | (A) | 100 | — | 100 | — | 50 | 70 | — |
|  | (B) | — | 100 | — | 100 | 50 | 30 | — |
| Epoxy Compound | Celoxide 2021 | 60 | 40 | 50 | 50 | 100 | 50 | — |
|  | Epikote 828 | — | — | — | 10 | — | 10 | — |
| Aluminum compound | TEAACA | 1.0 | — | — | 1.0 | — | — | — |
|  | TPAA | — | 1.0 | — | — | 1.0 | 1.0 | — |
|  | TAANA | — | — | 0.5 | — | — | — | — |
|  | TSAA | — | — | 0.5 | — | — | — | — |
| Silicon compound | (a) | 2.0 | — | 2.0 | 4.0 | 4.0 | 4.0 | — |
|  | (b) | — | 4.0 | — | — | — | — | — |
|  | (c) | — | — | 1.0 | — | — | — | — |
| Photosensitizer | Benzophenone | 0.5 | — | 0.5 | 0.5 | — | 0.5 | — |
|  | Thioxanthone | — | 0.5 | — | — | 0.5 | — | — |
| Measurement Results | Number of days until gellation (dark place, 25 C) | >60 | >60 | >60 | >60 | >60 | >60 | >60 |
|  | Thickness of film (μm) | 25 | 22 | 21 | 19 | 23 | 22 | 20 |
|  | Pencil hardness | H | H | HB | HB | 2H | H | B |
|  | Adhesive (*) | 100/100 | 100/100 | 100/100 | 100/100 | 100/100 | 100/100 | 46/100 |

(*)Number of remaining cross-cuttings in total 100 cross-cuttings.

EXAMPLES 12 TO 17

To the composition obtained in Example 10 were further formulated, as pigments, titanium dioxide, calcium carbonate, zinc stearate, phthalocyanine green, phthalocyanine blue and carbon black in amounts as shown in Table 3 (mixing ratio was shown as parts by weight based on 100 parts by weight of the composition in Example 10) to prepare 6 kinds of resin compositions of this invention.

COMPARATIVE EXAMPLE 5

To the composition obtained in Comparative example 1 was further formulated carbon black in an amount as shown in Table 3 (mixing ratio was shown as parts by weight based on 100 parts by weight of the composition in Comparative example 1).

Measurement results and evaluation tests of the days to gellation; thickness of the film; pencil hardness; and adherence concerning the samples in Examples 12 to 17 and Comparative example 5 were carried out in the same manner as in Examples 6 to 11 and Comparative example 4.

The results of Examples 12 to 17 and Comparative example 5 are shown in Table 3 all together.

TABLE 3

|  |  | Example |  |  |  |  |  | Comparative example 5 |
|---|---|---|---|---|---|---|---|---|
|  |  | 12 | 13 | 14 | 14 | 16 | 17 |  |
| Pigment | Titanium dioxide | 10 | — | — | — | — | — | — |
|  | Calcium carbonate | — | 50 | — | — | — | — | — |
|  | Zinc stearate | — | — | 50 | — | — | — | — |
|  | Phthalocyanine Green | — | — | — | 5 | — | — | — |
|  | Phthalocyanine Blue | — | — | — | — | 5 | — | — |
|  | Carbon black | — | — | — | — | — | 10 | 10 |
| Measurement Results | Thickness of film (μm) | 15 | 15 | 14 | 17 | 14 | 14 | 14 |
|  | Pencil hardness | H | H | H | H | H | 2H | 2B |
|  | Adhesive (*) | 98/100 | 100/100 | 100/100 | 100/100 | 100/100 | 100/100 | 8/100 |

EXAMPLE 18

A resin composition of this invention was prepared by formulating, 100 g of reaction product (A) as the spiro ortho ester compound; 1 g of tris(n-butylacetoacetonato)aluminum as the aluminum compound; 10 g of triphenyl(tert-butylperoxy)silane as the silanol compound or the silicon compound capable of generating a silanol group; 400 g of ERL 4221 (trade name, available from Union Carbide Corp., an alicyclic epoxy resin, epoxy equivalent: 145) as the epoxy resin; and 5 g of benzophenone as the photosensitizer, and then by stirring at 60° C. for 10 minutes.

After a light-emitting element was immersed into the thus prepared resin composition and was taken out, irradiation with light was effected for three minutes. Employed as the light source was two sets of high-pressure mercury lamps of 80 W/cm each, which were positioned 10 cm distant from the light source. Further, post-curing was carried out for 2 hours at 150° C. Performance of a cured product thus manufactured was tested to obtain the results shown in Table 4.

TABLE 4

| Appearance | colorless, transparent |
|---|---|
| Water resistance | no deterioration in light output $P_o$, at 90° C., 90% RH, after 2000 Hr |
| Heat resistance | no deterioration in light output $P_o$, at 120° C., after 1000 Hr |
| Pewter resistance | no generation of crack, in 300° C. pewter bath for 15 seconds dipping |
| Continuous energizing test | deterioration of $P_o$ under conditions of IF = 40 mA, 25° C., after 110 Hr: −30% |

EXAMPLE 19

Into the resin composition prepared in Example 18 was dipped a helical coil which was prepared by subjecting an electrical wire (available from Showa Densen Co. Ltd., AIW wire, 1 mm in diameter) an amidimide treatment, and then irradiation with ultra-violet ray was made on the resin of the coil at a 10 cm distance.

Employed light-source was 5 Kw metal halide lamp (80 W/cm, available from K. K. Toshiba). Afterward, post-curing was made at 150° C. for 3 hours.

The resin dropping percentage of the thus obtained coil was zero and the strength thereof was 6.9 according to the bending test (JIS-C 2103-29-3 (1977)) and thus it was shown excellent performances.

EXAMPLES 20 TO 21

Ethylene thiocarbonate and ethylene glycol were reacted by the conventional manner to obtain a spiro ortho carbonate (hereinafter referred to as SPOC).

Two kinds of resin compositions of this invention were prepared by formulating, the reaction compound (A) in Example 1 as the ortho ester compound in addition to the above SPOC; tris(acetylacetonato)aluminum (TAANA) as the aluminum compound; triphenylsilanol (TDSH) as the silicon compound having a silanol group as shown in Table 5. The volumetric shrinkage percentage and the crack index thereof were measured in the same manner as in Examples 1 to 5. Results are shown in Table 5 below.

TABLE 5

|  | Example |  | Comparative example |  |
|---|---|---|---|---|
|  | 20 | 21 | 6 | 7 |
| SPOC | 100 | 500 | 100 | 50 |
| Reaction product (A) | — | 50 | — | 50 |
| TAANA | 1 | 1 | — | 1 |
| TDSH | 3 | 3 | 3 | — |
| Volumetric shrinkage (%) | −1.41 | −1.32 | not cured | not cured |
| Crack index | 12.8 | 11.5 | cured | cured |

As is apparent from the foregoing results, it has been confirmed that the epoxy resin composition of this invention is excellent in low-volumetric shrinkage at curing operation and is good in storability. Therefore, the cured product can be used for wide variations of applications such as an ink, a coating, an adhesive, a surface coating, an encapsulation, an electrical insulating material, etc., and it should be concluded that the industrial value thereof is considerable.

We claim:

1. A resin composition which comprises
   (A) a spiro ortho ester compound and/or a spiro ortho carbonate compound;
   (B) an aluminum compound; and
   (C) a silanol compound or a silicon compound which is capable of generating a silanol group;

the amounts of components (B) and (C) being within the range of 0.001 to 10% by weight and 0.1 to 20% by weight, based on the amount of component (A), respectively.

2. The resin composition according to claim 1, wherein the spiro ortho ester compound is a reaction product of an epoxy compound and a lactone.

3. The resin composition according to claim 2, wherein the epoxy compound (A) is selected from the group of compounds consisting of ethylene oxide, propylene oxide, butylene oxide, styrene oxide, phenyl glycidyl ether, butyl glycidyl ether, a bisphenol A epoxy resin, a bisphenol F epoxy resin, a phenol-novolac epoxy resin, an alicyclic epoxy resin, a heterocyclic ring-containing epoxy resin, a hydrogenated bisphenol A epoxy resin, an aliphatic epoxy resin, an epoxy resin obtained by the reaction of an aromatic, aliphatic or alicyclic carboxylic acid with epichlorohydrin; a spiro ring-containing epoxy resin, a glycidyl ether epoxy resin and a glycidyl ester epoxy resin or (B) is a mixture of two or more compounds selected from said group of compounds.

4. The resin composition according to claim 3, wherein the lactone (A) is selected from the group of lactones consisting of $\beta$-propiolactone, $\gamma$-butyrolactone, $\alpha$-chlorobutyrolactone, $\beta$-methylburtyrolactone, $\gamma,\gamma$-dimethylbutyrolactone, $\gamma$-valerolactone, $\delta$-valerolactone, $\epsilon$-caprolactone and phthalide or (B) is a mixture of two or more compounds selected from said group of lactones.

5. The resin composition according to claim 2, wherein the spiro ortho carbonate compound is a compound represented by the formula:

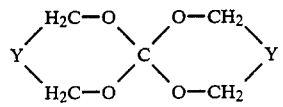

wherein Y represents a divalent hydrocarbon group.

6. The resin composition according to claim 1, wherein the aluminum compound is an organic aluminum chelate compound.

7. The resin composition according to claim 6, wherein the aluminum compound is an organic aluminum compound having a ligand selected from the group consisting of an alkoxy group, a phenoxy grouo, an acyloxy group, a $\beta$-diketonato group and an o-carbonylphenolato group.

8. The resin composition according to claim 7, wherein the aluminum compound (A) is selected from the group of compounds consisting of trisacetylacetonatoaluminum, trisethylacetoacetatoaluminum, trissalycilaldehydatoaluminum, trispropylacetoacetatoaluminum and tris(n-butylacetoacetonato)aluminum or (B) is a mixture of two or more compounds selected from said group of compounds.

9. The resin composition according to claim 6, wherein the aluminum compound is present in an amount of 0.1 to 5% by weight based on the component (A).

10. The resin composition according to claim 1, wherein the silanol compound is a compound represented by the following formula (I) or (II):

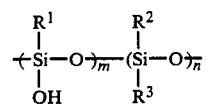

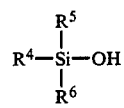

wherein $R^1$, $R^2$ and $R^3$ each represent a hydrogen atom, an alkyl group, a phenyl group or an unsaturated group which is unsubstituted or is substituted with an alkoxy group or a siloxane group; m is a number of 1 or more; n is 0 or an integer of 1 or more; and $R^4$, $R^5$ and $R^6$ each represent an alkyl group, a phenyl group, an alkoxy group or a hydroxy group.

11. The resin composition according to claim 1, wherein compound (C) is a silicon compound capable of generating a silanol group by hydrolysis.

12. The resin composition according to claim 11, wherein the silicon compound capable of generating a silanol group by hydrolysis comprises an organosilane represented by the following formula (III):

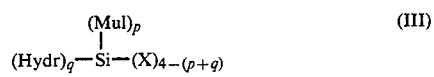

wherein Mul represents a phenyl group, a vinyl group, a 2-butenyl group or a 2-pentenyl group; Hydr represents a hydrolyzable group; X represents a substituted or unsubstituted alkyl group having 1 to 5 carbon atoms, provided that the substituent is an inactive group which does not participate in the polymerization reaction, or an aralkyl group which is unsubstituted or carries a substituent that is inactive in the polymerization reaction; and p represents an integer of 1 to 3, q represents an integer from 1 to 4 and p+q are 4 or less, or an organosiloxane comprising a bifunctional unit represented by the following formula (IV) and/or a trifunctional unit represented by the following formula (V), and the terminal end of the organosiloxane has been stopped with the monofunctional unit represented by the following formula (VI):

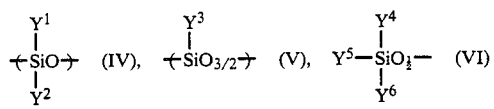

wherein $Y^1$, $Y^2$, $Y^3$, $Y^4$, $Y^5$ and $Y^6$ are the same or different and each represents a hydrolyzable group; a group having an ethylenically unsaturated double bond; or a substituted or unsubstituted alkyl group having 1 to 5 carbon atoms, provided that each substituent is an inactive group which does not participate in the polymerization reaction.

13. The resin composition according to claim 1, wherein compound (C) is a silicon compound capable of generating a silanol group by irradiation of light.

14. The resin composition according to claim 13, wherein the silicon compound capable of generating a silanol group by irradiation of light is a compound having a group selected from the group consisting of a peroxysilyl group, an o-nitrobenzyloxy group and an α-ketosilyl group.

15. The resin composition according to claim 14, wherein compound (C) is a silicon compound having a peroxysilyl group, represented by the following formula (IX):

$$(R^7)_r Si{-}O{-}O{-}R^8)_{4-r} \tag{IX}$$

wherein $R^7$ represents a hydrogen atom, a halogen atom, an alkyl group having 1 to 5 carbon atoms, an alkoxy group having 1 to 5 carbon atoms or an aryl group; $R^8$ represents an alkyl group having 1 to 5 carbon atoms or an aryl group; and r is an integer of 0 to 3.

16. The resin composition according to claim 13, wherein compound (C) is a silicon compound having an o-nitrobenzyloxy group, represented by the following formula (X):

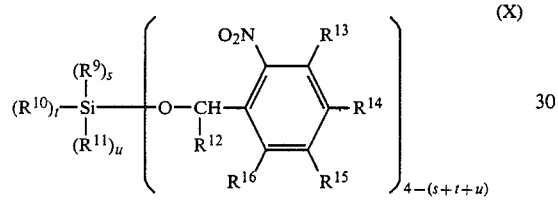

wherein $R^9$, $R^{10}$ and $R^{11}$ are the same or different and each represents a hydrogen atom, a halogen atom, a vinyl group, an allyl group, a substituted or unsubstituted alkyl group having 1 to 10 carbon atoms, an alkoxy group having 1 to 10 carbon atoms, a substituted or unsubstituted aryl group, an aryloxy group or a siloxy group; $R^{12}$ represents a hydrogen atom, a substituted or unsubstituted alkyl group having 1 to 10 carbon atoms or a substituted or unsubstituted phenyl group; $R^{13}$, $R^{14}$, $R^{15}$ and $R^{16}$ are the same or different and each represents a hydrogen atom, a nitro group, a cyano group, a hydroxy group, a mercapto group, a halogen atom, an acetyl group, an allyl group, an alkyl group having 1 to 5 carbon atoms, an alkoxy group having 1 to 5 carbon atoms, a substituted or unsubstituted aryl group or aryloxy group; and s, t and u are integers satisfying the conditions of $0 \leq s$, t, $u \leq 3$ and $1 \leq s+t+u \leq 3$.

17. The resin composition according to claim 13, wherein compound (C) is a silicon compound having as a terminal group an o-nitrobenzyloxysilyl group and as a principle chain a group represented by the formula (XI):

wherein n is an integer of 1 or more; $R^9$ and $R^{10}$ are the same or different and each represents a hydrogen atom, a halogen atom, a vinyl group, an allyl group, a substituted or unsubstituted alkyl group having 1 to 10 carbon atoms, an alkoxy group having 1 to 10 carbon atoms, a substituted or unsubstituted aryl group, an aryloxy group or a siloxy group; and X and Y are same or different and each represents an oxygen atom, an alkylene group or an aryl group.

18. The resin composition according to claim 14, wherein the silicon compound capable of generating a silanol group by irradiation of light has an α-ketosilyl group and is represented by the following formula (XII):

wherein $R^{17}$ represents a substituent selected from the group consisting of an alkyl group having 1 to 10 carbon atoms, a vinyl group, an allkyl group, an aryl group, and an aryloxy group and an alkoxy group having 1 to 10 carbon atoms, said substituent being unsubstituted or substituted by a halogen atom, $-NO_2$, $-CN$ or $-OCH_3$; and v represents an integer of 0 to 3.

19. The resin composition according to claim 1, wherein the silanol compound or silicon compound which is capable of generating a silanol group is present in an amount of 1 to 15% by weight based on the component (A).

20. The resin composition according to claim 1, wherein the resin composition further comprises a photosensitizer.

21. The resin composition according to claim 20, wherein the photosensitizer (A) is selected from the group of compounds consisting of aromatic hydrocarbons, benzophenone and derivatives thereof, esters of o-benzoylbenzoic acids, acetophenone and derivatives thereof, benzoin and benzoin ethers and derivatives thereof, xanthone and derivatives thereof, thioxanthone and derivatives thereof, disulfide compounds, quinone compounds, halogenated hydrocarbons and amines or (B) is a mixture of two or more compounds selected from said group of compounds.

22. A resin composition according to claim 5, wherein said divalent hydrocarbon group is selected from the group consisting

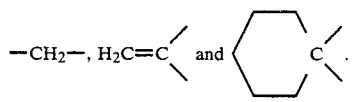

* * * * *